(12) United States Patent
Havanur (10) Patent No.: US 10,622,994 B2
(45) Date of Patent: Apr. 14, 2020

(54) DEVICES AND METHODS FOR DRIVING A SEMICONDUCTOR SWITCHING DEVICE

(71) Applicant: Vishay-Siliconix, San Jose, CA (US)

(72) Inventor: Sanjay Havanur, San Jose, CA (US)

(73) Assignee: Vishay-Siliconix, LLC, San Jose, CA (US)

( * ) Notice: Subject to any disclaimer, the term of this patent is extended or adjusted under 35 U.S.C. 154(b) by 0 days.

(21) Appl. No.: 16/002,413

(22) Filed: Jun. 7, 2018

(65) Prior Publication Data

US 2019/0379375 A1 Dec. 12, 2019

(51) Int. Cl.
*H03K 17/687* (2006.01)
*H03K 17/567* (2006.01)

(52) U.S. Cl.
CPC ....... *H03K 17/6872* (2013.01); *H03K 17/567* (2013.01)

(58) Field of Classification Search
USPC ................................. 327/108–112
See application file for complete search history.

(56) References Cited

U.S. PATENT DOCUMENTS

| 5,613,229 A | 3/1997 | Baranowski et al. |
| 5,644,265 A * | 7/1997 | Austin ............ H03K 19/00315 327/333 |
| 5,680,300 A * | 10/1997 | Szepesi .................... H02M 3/07 363/59 |
| 5,705,919 A * | 1/1998 | Wilcox .................... G05F 1/618 323/268 |
| 5,850,153 A * | 12/1998 | Harris ............. H03K 19/00315 326/58 |
| 7,023,672 B2 | 4/2006 | Goodfellow et al. |
| 7,091,752 B2 * | 8/2006 | Balakrishnan .... H02M 3/33592 327/108 |
| 7,307,458 B1 * | 12/2007 | Segervall ............ G06F 13/4072 326/30 |
| 8,044,610 B2 | 10/2011 | Sandner et al. |
| 8,077,497 B2 * | 12/2011 | Ogata ................ G11C 13/0007 365/100 |
| 8,120,391 B2 * | 2/2012 | Bayerer ............. H03K 17/0406 327/108 |
| 8,228,962 B2 | 7/2012 | Mortensen et al. |
| 8,310,329 B1 * | 11/2012 | Herbert ............... H01F 27/2804 336/186 |
| 8,854,019 B1 * | 10/2014 | Levesque ................ H02M 3/07 323/266 |
| 2002/0171374 A1 * | 11/2002 | Yasui ..................... H05B 6/685 315/219 |

(Continued)

FOREIGN PATENT DOCUMENTS

| JP | S5668341 | 6/1981 |
| JP | 2007336694 | 12/2007 |
| WO | 2014128942 | 8/2014 |

*Primary Examiner* — Adam D Houston (57) ABSTRACT

A driver for a semiconductor switching device can be configured to step down a supply voltage to generate a first drive voltage. The driver can also generate a second drive voltage equal to the potential difference between the supply voltage and the first drive voltage. The driver can supply the first drive voltage to a control gate of the semiconductor switching device during a first state of a control signal, and a reverse polarity of the second drive voltage during a second state of the control signal.

31 Claims, 4 Drawing Sheets

(56) References Cited

U.S. PATENT DOCUMENTS

| | | | |
|---|---|---|---|
| 2005/0024103 A1* | 2/2005 | Nascimento | H03K 17/0406 327/112 |
| 2005/0218943 A1* | 10/2005 | Padhye | G06F 1/3203 327/109 |
| 2005/0219158 A1* | 10/2005 | Shoji | G09G 3/2946 345/63 |
| 2005/0219875 A1* | 10/2005 | Millner | H02M 7/53871 363/56.01 |
| 2007/0023399 A1* | 2/2007 | Buhler | B23H 1/022 291/69.18 |
| 2008/0150858 A1* | 6/2008 | Nishi | G09G 3/20 345/87 |
| 2009/0160495 A1* | 6/2009 | Chen | H04L 25/0276 327/108 |
| 2009/0289693 A1* | 11/2009 | Motamed | H03K 19/00315 327/437 |
| 2009/0302814 A1* | 12/2009 | Kapels | H02M 3/1588 323/282 |
| 2010/0308739 A1* | 12/2010 | Shteynberg | H05B 33/083 315/193 |
| 2011/0182446 A1* | 7/2011 | Shajaan | H02M 3/156 381/150 |
| 2011/0300816 A1* | 12/2011 | Collados | H04L 27/04 455/102 |
| 2012/0044722 A1* | 2/2012 | Cuk | H02M 3/335 363/21.03 |
| 2012/0206170 A1* | 8/2012 | Kimura | H03K 17/04123 327/109 |
| 2012/0229212 A1* | 9/2012 | Konecny | H03F 3/2173 330/251 |
| 2013/0076322 A1 | 3/2013 | Tateno et al. | |
| 2014/0321008 A1* | 10/2014 | Keane | H01H 11/00 361/56 |
| 2014/0327422 A1* | 11/2014 | Rommel | H03K 17/0822 323/283 |
| 2015/0188532 A1* | 7/2015 | Lenz | H03K 5/023 327/109 |
| 2015/0318855 A1* | 11/2015 | Song | H03K 19/0013 327/108 |
| 2015/0356909 A1* | 12/2015 | Lim | H03K 17/162 345/205 |
| 2015/0358011 A1* | 12/2015 | Tang | H03K 5/1534 327/109 |
| 2015/0372672 A1* | 12/2015 | Ohashi | H03K 17/08122 327/109 |
| 2016/0061905 A1* | 3/2016 | Kikuchi | H03K 17/687 324/434 |
| 2016/0065064 A1* | 3/2016 | Zojer | H02M 7/219 323/271 |
| 2016/0087627 A1* | 3/2016 | Jang | H03K 17/6871 345/214 |
| 2017/0054306 A1* | 2/2017 | Vo | H01M 10/4257 |
| 2017/0149330 A1 | 5/2017 | Osanai | |
| 2017/0179827 A1* | 6/2017 | Cheng | H02M 1/32 |
| 2017/0264288 A1* | 9/2017 | Wu | H03K 17/6872 |
| 2018/0226817 A1* | 8/2018 | Heiling | H02J 7/0034 |
| 2018/0348075 A1* | 12/2018 | Rubinstein | F17C 1/00 |
| 2018/0351769 A1* | 12/2018 | Tajalli | H03K 17/6871 |
| 2019/0103750 A1* | 4/2019 | Kristensen | H02J 7/0026 |
| 2019/0103824 A1* | 4/2019 | Kim | H02N 2/181 |
| 2019/0140635 A1* | 5/2019 | Abesingha | H03K 17/08122 |

* cited by examiner

DEVICES AND METHODS FOR DRIVING A SEMICONDUCTOR SWITCHING DEVICE

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing devices is high speed semiconductor switching devices for use in high speed communication, power supplies, and numerous other applications.

Fast switching of semiconductor device can impose challenges at both the component and system level. Fast rise and fall of high voltages and currents can cause Electromagnetic Interference (EMI) and/or Electromagnetic Compatibility (EMC) issues. The fast switching can also interact with parasitic elements in a circuit and produce undesirable effects. Accordingly, there is a continuing need for improved driver circuits for use with high speed semiconductor switching devices.

SUMMARY OF THE INVENTION

The present technology may best be understood by referring to the following description and accompanying drawings that are used to illustrate embodiments of the present technology directed toward drivers for semiconductor switching devices.

In aspects, a driver for high speed semiconductor switching devices, that can switch large voltages or currents, can include a plurality of switches and a controller operating from a single supply potential. The supply potential can be stepped down internally to create a lower voltage of the same polarity. The switches can be configured to charge a capacitor to a difference between the supply voltage and the internally generated lower voltage. An output of the driver can provide the generated lower voltage to turn on the semiconductor switching device, and a reverse polarity of the differential voltage between the supply and the internally generated lower voltage to turn off the semiconductor switching device.

In one embodiment, the driver can include a voltage regulator configured to generate a first drive voltage from a supply voltage, wherein the first drive voltage is less than or equal to the supply voltage. A drive controller can be configured to provide a difference between the supply voltage and the first drive voltage as a second drive voltage. A storage element of the driver can be configured to store the second drive voltage. The drive controller can also be configured to provide the first drive voltage at an output of the driver in response to a first state of a control signal, and the second drive voltage at the output of the driver in response to a second state of the control signal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's switches, logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 1:
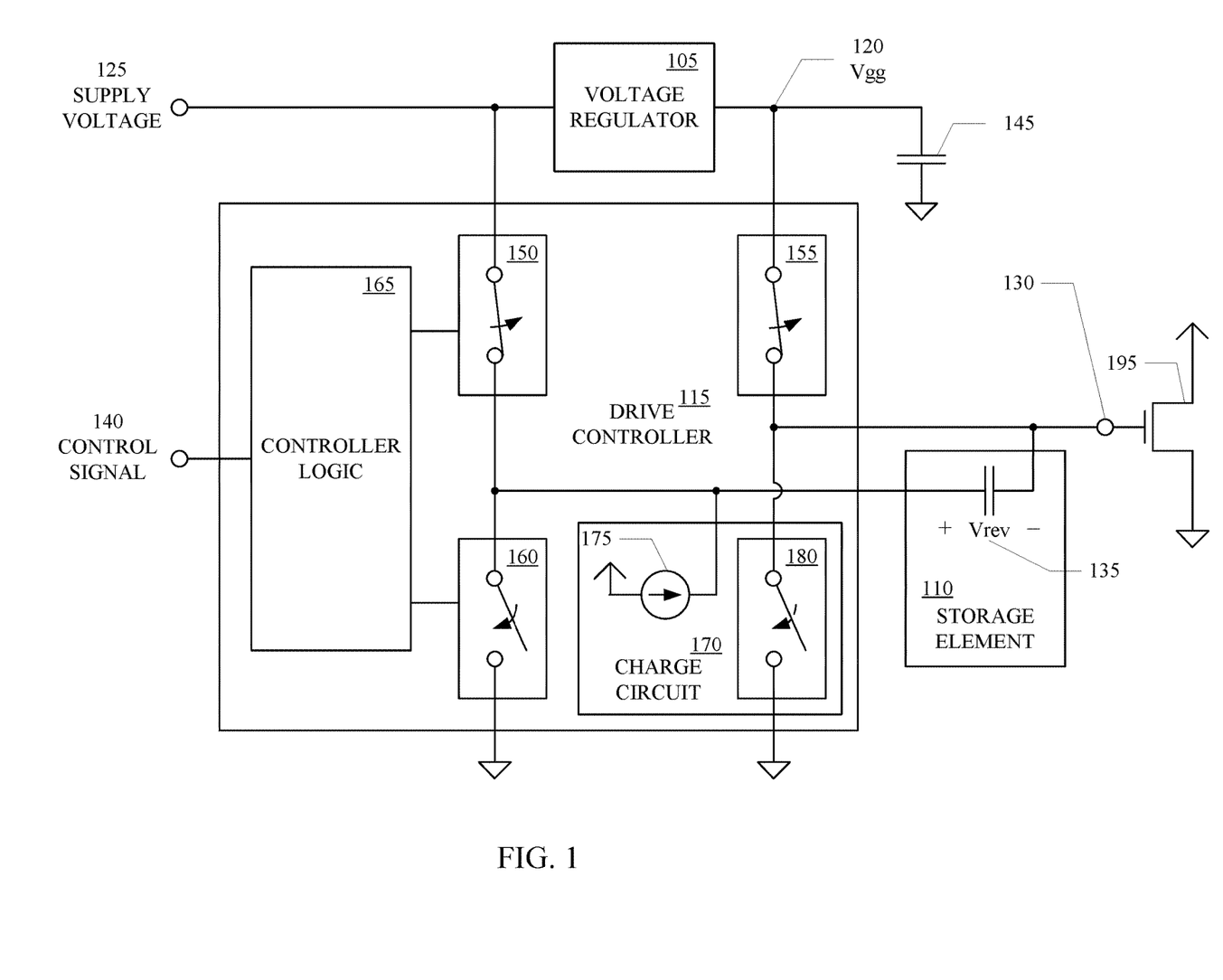
FIG. 1 shows a driver, in accordance with aspects of the present technology.

Referring to FIG. 1, a driver, in accordance with aspects of the present technology, is shown. The driver can include a voltage regular 105, a storage element 110, and a drive controller 115. The voltage regulator 105 can be configured to generate a first drive voltage (Vgg) 120 from a supply voltage (Vcc) 125, wherein the first drive voltage 120 is less than or equal to the supply voltage (Vcc) 125.

The drive controller 115 can be configured to provide the first drive voltage (Vgg) 120 at an output 130 of the driver, and a difference between the supply voltage (Vcc) 125 and the first drive voltage (Vgg) 120 as a second drive voltage (Vrev) 135 to the storage element 110 in response to a first state of a control signal 140. The drive controller 115 can also be configured to provide a reverse polarity of the second drive voltage (Vrev) 135 at the output 130 of the driver in response to a second state of the control signal 140.

In one implementation, the voltage regulator 105 can be configured to maintain a substantially constant value of the first drive voltage (Vgg) 120. In another implementation, the voltage regulator 105 can be configured to maintain a substantially constant value of the second drive voltage (Vrev) 135. The driver may optionally include a filter element 145 coupled to the second drive voltage (Vgg) 120 from the voltage regulator 105.

In one implementation, the drive controller 115 can include a first switching element 150, a second switching element 155, a third switching element 160, and a controller logic 165. The first switching element 150 can be coupled between the supply voltage (Vcc) 125 and the storage element 110. The second switching element 155 can be coupled between the first drive voltage (Vgg) 120 and the output 130 of the driver. The third switching element 160 can be coupled between the storage element 110 and a ground potential of the driver. The controller logic 165 can be configured to close the first and second switching elements 150, 155, and open the third switching element 160 in a first state of the control signal 140. The controller logic 165 can also be configured to open the first and second switching elements 150, 155, and close the third switching element 160 in a second state of the control signal 140. In one implementation, the control signal 140 can be a Pulse Width Modulation (PWM) signal.

In aspects, the driver can be configured to drive a switching device 195. The output 130 of the driver can be coupled to a control terminal of the switching device 195. In one implementation, the switching device 195 can be a Wide Band Gap (WBG) power semiconductor. In another implementation, the switching device 195 can be a High Electron Mobility Transistor (HEMT). In another implementation, the switching device 195 can be a Gallium Nitride (GaN) Metal Oxide Semiconductor Field Effect Transistor (MOSFET). In another implementation, the switching device 195 can be a Silicon (Si) MOSFET. In yet another implementation, the switching device 195 can be an Insulated Gate Bipolar Transistor (IGBT). The driver can be configured to supply the first drive voltage (e.g., positive voltage Vgg) to the control terminal of the switching device 195 when the control signal is in a first state (e.g., high voltage), and a reverse polarity of the second drive voltage (e.g., negative voltage Vrev 135) to the control terminal of the switching device 195 when the control signal is in a second state (e.g., low voltage).

In one example, when the control signal 140 is in a high state, the control logic 165 can cause the first and second switching elements 150, 155 to be closed (i.e., on) and the third switching element 160 to be open (i.e., off). When the first and second switching elements 150, 155 are closed, the first switching element 150 couples a first terminal of the storage element 110 to the supply voltage (Vcc) 125 and the second switching element 155 couples the first drive voltage (Vgg) 120 to the output 130 of the driver and to a second terminal of the storage element 110. With the supply voltage (Vcc) 125 present at the first terminal of the storage element 110 and the first drive voltage (Vgg) 120 present at the second terminal, the storage element 110 can be charged to the second drive voltage (Vrev) 135. Furthermore, the output 130 of the driver can provide the positive polarity supply voltage (Vgg) 120 to a control gate of a switching device 195 when the control signal 140 is high.

When the control signal 140 switches from the high state to a low state, the controller logic 165 can cause the first and second switching elements 150, 155 to open (i.e., turn off), and a short time later the third switching element 160 to close (i.e., turn on). A small delay between when the first and second switching elements 150, 155 open and the third switch element 160 closes can prevent cross conduction. When the first and second switching elements 150, 155 are open and the third switching element 160 is closed, the first terminal of the storage element 110 is coupled to a ground potential and the second terminal of the storage element 110 is coupled to the output 130 of the driver. As a result, the output 130 of the driver can provide a negative (i.e., reverse) polarity second drive voltage (Vrev) 135 to the control gate of the switching device 195 when the control signal 140 is low. The negative polarity drive voltage output to the control gate of the switching device 195 can provide for fast turn off of the switching device 195. When the control signal 140 switches form the low state to the high state, the controller logic 165 can cause the third switching element 160 to open, and a short time later the first and second switching elements 150, 155 to close.

The driver controller 115 can optionally include a charge circuit 170 configured to pre-charge the storage element 110 to the first drive voltage (Vgg). The charge circuit 170 can include a current source 175 and a fourth switching element 180. The current source 175 can be coupled to the storage element 110. The fourth switching element 180 can be coupled to the output 130 of the driver. The controller logic 165 can be further configured to open the first, second and third switching elements 150-160, and close the fourth switching element 180 in a startup or suspend mode of operation. The controller logic 165 can also be configured to disable the current source 175 and open the fourth switching element 180 during normal operation.

In one example, if the supply voltage (Vcc) 125 is below a predetermined operational level (e.g., startup mode), the first, second and third switching elements 150-160 can be open (i.e., turned off) and the fourth switching element 180 can be closed. The current source 175 can charge the storage element 110 to the second drive voltage. Thereafter, the drive can operate as described above when the supply voltage (Vcc) 125 is within the predetermined operational level.

In one implementation, the voltage regulator 105 and drive controller 115 can be separate circuits, or can be integrated together. In one implementation, the first, second and third switching elements 150-160 and the controller logic 165 can be monolithically fabricated in an integrated circuit (IC). In another implementation, the first, second and third switching elements 150-160 can be co-packaged with the controller logic 165. In such an implementation, the first, second and third switching elements 150-160 and the control logic 165 can be fabricated on separate dies, and then enclosed in a common package. In yet another implementation, the first, second and third switching elements 150-160 can be separate components externally coupled to the control logic 165. In one implementation, the storage element 110 can be externally coupled to the IC, or externally coupled to the co-packaged controller logic 165 and the first, second and third switching elements 150-160. If the filter element 145 is included, the filter element 145 can also be externally coupled to the IC, or externally coupled to the co-packaged controller logic 165 and the first, second and third switching elements 150-160.

Generally, WBG power semiconductors, HEMTs, GaN MOSFETs, Si MOSFETs, IGBTs, and the like can be utilized in high frequency power conversion circuits, RF front-end transmitter and the like. In order to reduce switching losses and increase the operating frequency, such devices need to achieve extremely fast turn on and off speeds. The above described driver can provide a positive supply voltage during a first state of a control signal and a reverse polarity of a second drive signal to the control gate of the WBG power semiconductors, HEMTs, GaN MOSFETs, Si MOSFETs, IGBTs, or the like so that the switching device can switch large voltages or currents very fast while reducing EMI and/or EMC, and other deleterious effects in the circuit.

Figure 2:
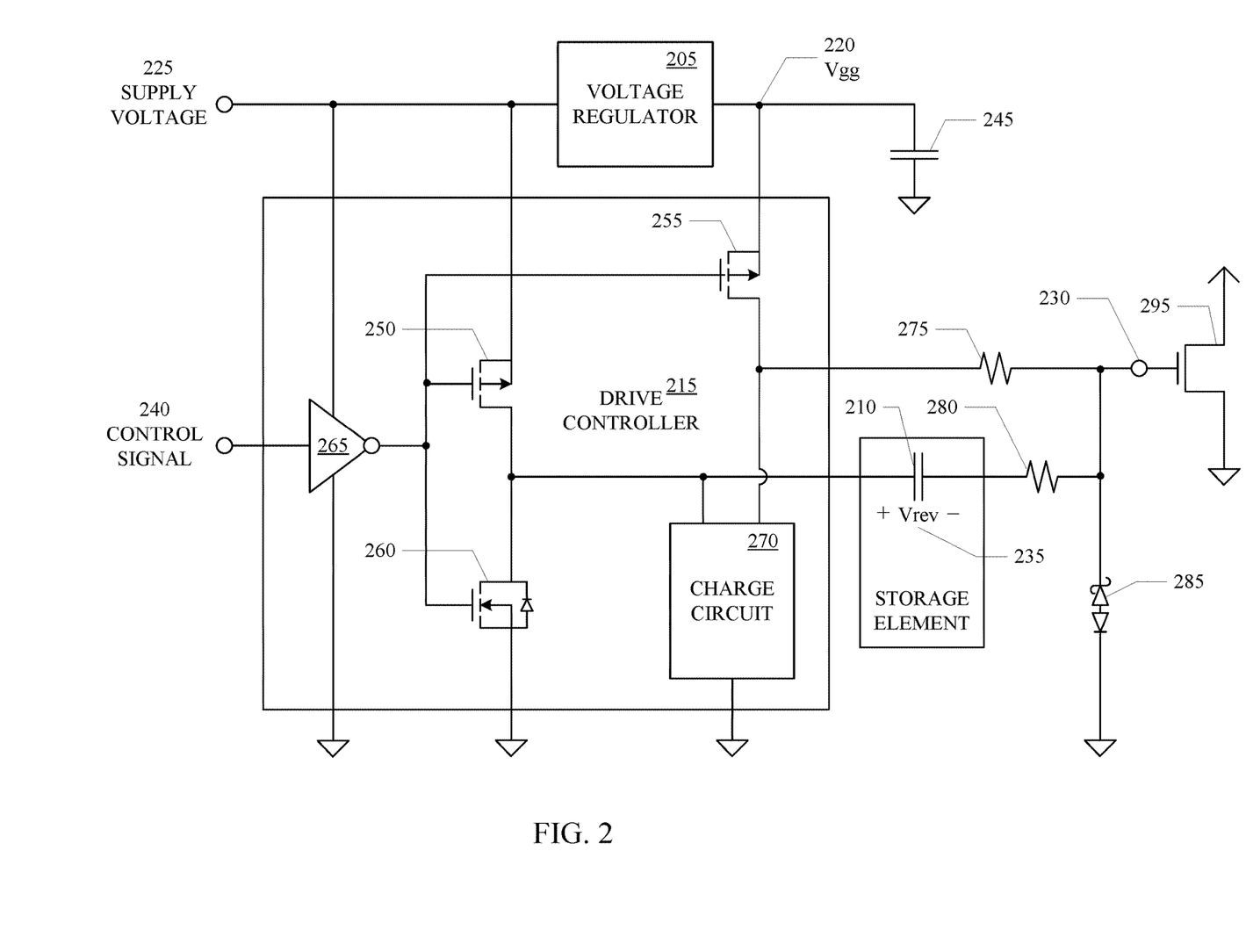
FIG. 2 shows a driver, in accordance with aspects of the present technology.

Referring to FIG. 2, a driver, in accordance with aspects of the present technology, is shown. The driver can include a voltage regulator 205, a storage element 210, and a drive controller 215. The voltage regulator 205 can be configured to generate a first drive voltage (Vgg) 220 from a supply voltage (Vcc) 225, wherein the first drive voltage (Vgg) 220 is less than or equal to the supply voltage (Vcc) 225.

The drive controller 215 can be configured to provide the first drive voltage (Vgg) 220 at an output 230 of the driver, and a difference between the supply voltage (Vcc) 225 and the first drive voltage (Vgg) 220 as a second drive voltage (Vrev) 235 to the storage element in response to a first state of a control signal 240. The drive controller 215 can also be configured to provide a reverse polarity of the second drive voltage (Vrev) 235 at the output 230 of the driver in response to a second state of the control signal 240.

The storage element can be configured to store the second drive voltage (Vrev) 235. In one implementation, the storage element can be a first capacitor 210 configured to store the second drive voltage (Vrev). In one implementation, the voltage regulator 205 can be configured to maintain a substantially constant value of the first drive voltage (Vgg) 220. In another implementation, the voltage regulator 205 can be configured to maintain a substantially constant value of the second drive voltage (Vrev) 235. The driver may optionally include a filter element coupled to the second drive voltage 220 from the voltage regulator 205. In one implementation, the filter element can be a second capacitor 245.

In one implementation, the drive controller 215 can include a first switching element, a second switching element, a third switching element, and a controller logic. In one implementation, the first and second switching elements can be a first and second P-type Metal Oxide Semiconductor Field Effect Transistor (MOSFET) 250, 255, the third switching element can be a first N-type MOSFET 260, and the controller logic can be an inverter 265. The first P-type MOSFET 250 can include a source coupled to the supply voltage (Vcc) 225, a drain coupled to the first capacitor 210, and a gate coupled to an output of the inverter 265. The second P-type MOSFET 255 can include a source coupled to the first drive voltage (Vgg) 220, a drain coupled to the output 230 of the driver, and a gate coupled to the output of the inverter 265. The first N-type MOSFET 260 can include a drain coupled to the first capacitor 210, a source coupled to a ground potential of the driver, and a gate coupled to an output of the inverter 265.

In aspects, the driver can be configured to drive a semiconductor switching device 295. The switching device 295 can be a WBG power semiconductor, a HEMT, a GaN MOSFET, a Si MOSFET, an IGBT, or similar device. The driver can be configured to supply the first drive voltage (e.g., positive voltage Vgg) to the control terminal of the switching device 295 when the control signal 240 is in a first state (e.g., high voltage), and a reverse polarity of the second drive voltage (e.g., negative voltage Vrev) to the control terminal of the switching device 295 when the control signal 240 is in a second state (e.g., low voltage). In one implementation, the capacitance of the first capacitor 210 can be much larger than the internal gate-to-source capacitance of the semiconductor switching device 295. In addition, the capacitor 210 can be coupled between the output 230 of the driver and the first switching element 250 so that charge lost during off intervals of the semiconductor switching device 295 can be quickly replenished during an on interval of the semiconductor switching device 295.

In one example, the inverter 265 can be configured to bias the first and second P-type MOSFETs 250, 255 to turn on (e.g., conduct), and bias the N-type MOSFET 260 to turn off when the control signal 240 is high. The inverter 265 can also be configured to bias the first and P-type MOSFETs 250, 255 to turn off, and bias the N-type MOSFET 260 to turn on (e.g., conduct) when the control signal 240 is low. In one implementation, the control signal 240 can be a Pulse Width Modulation (PWM) signal.

When the first and second P-type MOSFETs 250, 255 are on (e.g., conducting) and the first N-type MOSFET 260 is off, the first P-type MOSFET 250 couples the first terminal of the first capacitor 210 to the supply voltage (Vcc) 225 and the second P-type MOSFET 255 couples the first drive voltage (Vgg) 220 to the output 230 of the driver and to a second terminal of the first capacitor 210. When the supply voltage (Vcc) 225 is present at the first terminal of the first capacitor 210 and the first drive voltage (Vgg) 220 is present at the second terminal, the first capacitor 210 can be charged to the second drive voltage (Vrev) 235. Furthermore, the output 230 of the driver can provide the positive polarity supply voltage (Vgg) 220 to a control gate of the semiconductor switching device 295 when the control signal is high.

When the control signal 240 switches from the high state to the low state, the inverter 265 can cause the first and second P-type MOSFETs 250, 255 to turn off and the first N-type MOSFET 260 to turn on (e.g., conduct). When the first and second P-type MOSFETs 250, 255 are off and the first N-type MOSFET 260 is on, the first terminal of the first capacitor 210 is coupled to a ground potential and the second terminal is coupled to the output 230 of the driver. As a result, the output 230 of the driver can provide a negative (i.e., reverse) polarity second drive voltage (Vrev) 235 to the control gate of the semiconductor switching device 295 when the control signal 240 is low. The negative polarity drive voltage output to the control gate of the semiconductor switching device 295 can provide for fast turn off of the semiconductor switching device 295.

The driver controller 215 can optionally include a charge circuit 270 configured to pre-charge the first capacitor 210 to the first drive voltage (Vgg). Optionally, a first resistor 275 can be coupled between the drain of the second P-type MOSFET 255 and the output 230 of the driver. A second resistor 280 can be coupled between the second terminal of the first capacitor 210 and the output 230 of the driver. A voltage clamp 285 can be coupled between the output 230 of the driver and the ground potential. The small resistors 275, 280, the voltage clamp 285 and other components can be added for more precise control of the switching characteristics of the driver and/or more precise control of the reverse biased gate drive.

In one implementation, the voltage regulator 205 and drive controller 215 can be separate circuits, or can be integrated together. In one implementation, the P and N-type MOSFETs 250-260 and the inverter 265 can be monolithically fabricated in an IC. In another implementation, the P and N-type MOSFETs 250-260 can be co-packaged with the inverter 265. In such an implementation, the MOSFETs 250-260 and the inverter 265 can be fabricated on separate dies, and then enclosed in a common package. In yet another implementation, the MOSFETs 250-260 can be separate components externally coupled to the inverter 265. In one implementation, the first capacitor 210 can be externally coupled to the IC, or externally coupled to the co-packaged inverter 265 and the MOSFETs 250-260. If the second capacitor 245 is included, the second capacitor 245 can also be externally coupled to the IC, or externally coupled to the co-packaged inverter 265 and the MOSFETs 250-260.

Figure 3A:
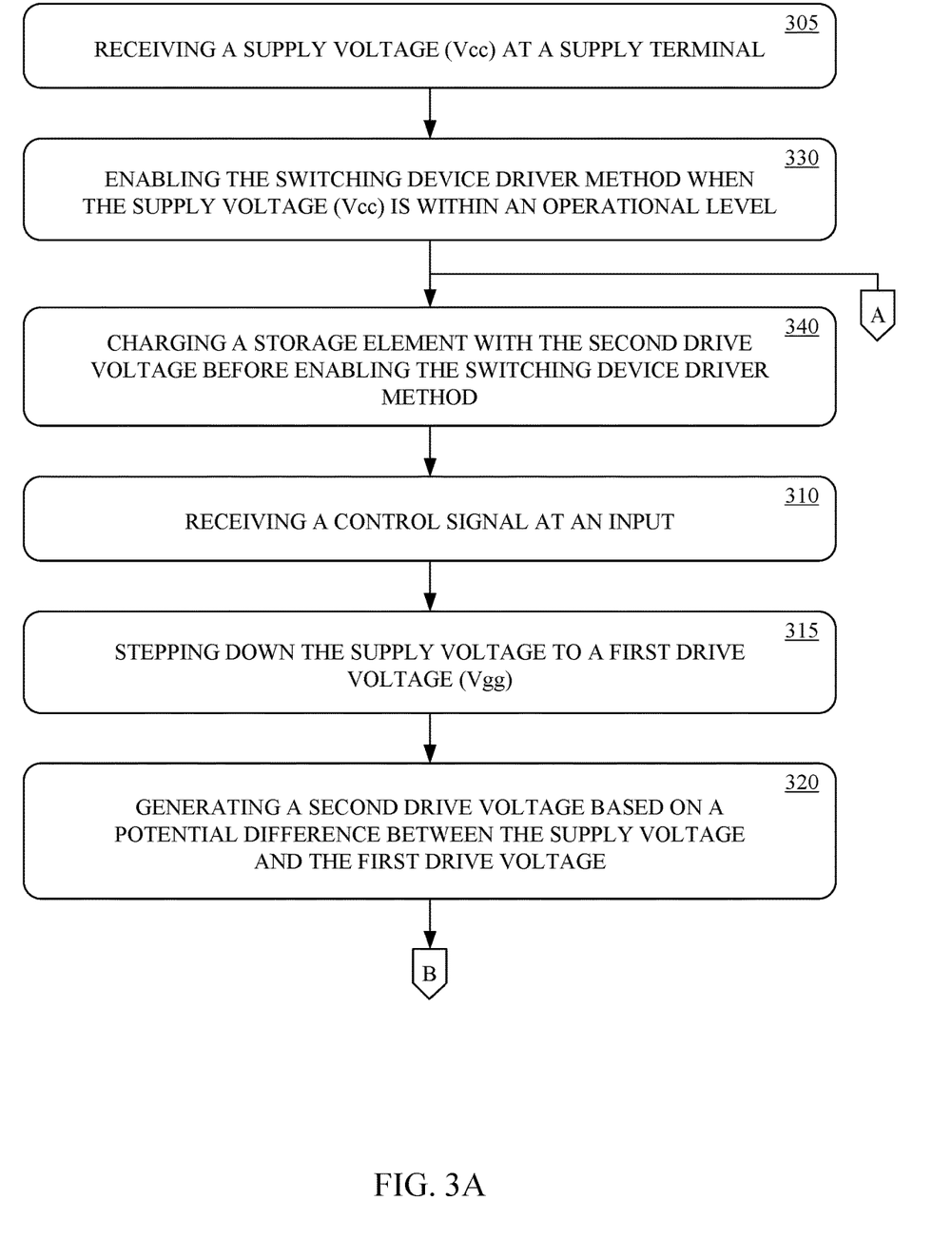
FIGS. 3A and 3B shows a switching device driver method, in accordance with aspects of the present technology.
Figure 3B:
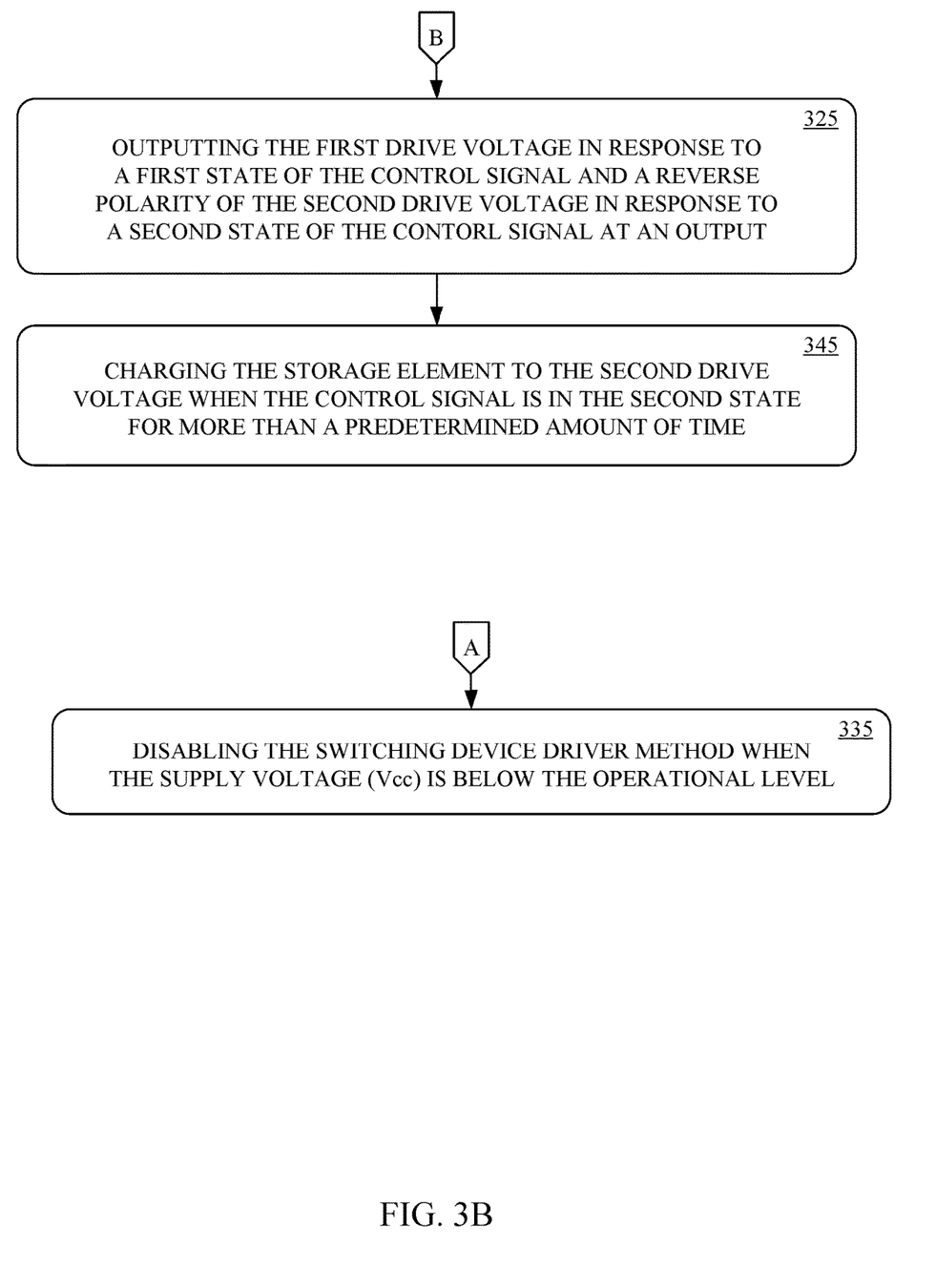

Referring now to FIG. 3, a switching device driver method, in accordance with aspects of the present technology, is shown. The method can include receiving a supply voltage (Vcc) at a supply terminal, at 305. At 310, a control signal can be received at an input.

At 315, the supply voltage (Vcc) can be stepped down to a first drive voltage (Vgg). At 320, a second drive voltage (Vrev) can be generated based on a potential difference between the supply voltage (Vcc) and the first drive voltage (Vgg). In one implementation, the second drive voltage (Vrev) can be generated by coupling the supply voltage (Vcc) to a first terminal of a storage element and coupling the first drive voltage (Vgg) to a second terminal of the storage element in response to a first state of the control signal.

At 325, the first drive voltage (Vgg) can be output in response to a first state of the control signal, and a reverse polarity of the second drive voltage (Vrev) can be output in response to a second state of the control signal. In one implementation, outputting the first drive voltage can include coupling the first drive voltage (Vgg) to the output in response to the first state of the control signal. The reverse polarity of the second drive voltage (Vrev) can be output by the second terminal of the storage element to the output and the first terminal of the storage element to a ground terminal in response to the second state of the control signal.

In addition, the switching device driver method can be enabled when the supply voltage (Vcc) is within an operational level, at 330. If the supply voltage (Vcc) is below the operation level, the switching device driver method can be disabled, at 335.

In addition, a storage element can be charged with the second drive voltage before enabling the switching device driver method, at 340. The storage element can also be charged with the second drive voltage when the control signal is in the second state for more than a predetermined amount of time, at 345.

In aspects, the driver method advantageously provides a positive gate voltage to turn on the switching semiconductor device, and a negative gate voltage to turn off the switching semiconductor device. In addition, the driver method advantageously generates the positive and negative gate voltages from a single supply potential.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A driver comprising:
   a voltage regulator configured to generate a first drive voltage from a supply voltage, wherein the first drive voltage is less than the supply voltage;
   a storage element configured to store a second drive voltage; and
   a drive controller configured to provide the first drive voltage at an output of the driver and a difference between the supply voltage and the first drive voltage as the second drive voltage to the storage element in response to a first state of a control signal, and to provide a reverse polarity of the second drive voltage at the output of the driver in response to a second state of the control signal.

2. The driver of claim 1, wherein the voltage regulator is configured to maintain a substantially constant value of the first drive voltage.

3. The driver of claim 1, wherein the voltage regulator is configured to maintain a substantially constant value of the second drive voltage.

4. The driver of claim 1, wherein the drive controller comprises:
   a first switching element coupled between the supply voltage and the storage element;
   a second switching element coupled between the first drive voltage and the output of the driver,
   a third switching element coupled between the storage element and a ground potential of the driver; and
   a controller logic configured to close the first and second switching elements and open the third switching element in a first state of the control signal, and to open the first and second switching elements and close the third switching element in a second state of the control signal.

5. The driver of claim 1, wherein the storage element comprises a first capacitor.

6. The driver of claim 5, wherein the drive controller comprises:
   an inverter including an input for receiving the control signal;
   a first P-type MOSFET including a source coupled to the supply voltage, a drain coupled to the first capacitor, and a gate coupled to an output of the inverter;
   a second P-type MOSFET including a source coupled to the first drive voltage, a drain coupled to an output of the driver, and a gate coupled to the output of the inverter;

a first N-type MOSFET including a drain coupled to the first capacitor, a source coupled to the ground potential, and a gate coupled to an output of the inverter; and the first capacitor coupled between the output of the driver and the drains of both the first and third transistors.

7. The driver of claim 6, wherein the control signal comprises a pulse width modulation signal.

8. The driver of claim 6, further comprising:
a first resistor coupled between the drain of the second P-type MOSFET and the gate output of the driver;
a second resistor coupled between the second terminal of the first capacitor and the output of the driver; and
a voltage clamp coupled between the output of the driver and the ground potential.

9. The driver of claim 1, further comprising a charge circuit configured to pre-charge the storage element to the first drive voltage.

10. The driver of claim 4, further comprising:
a current source coupled to the first terminal of the storage element;
a fourth switching element coupled to the output of the driver; and
the controller logic further configured to open the first, second and third switching elements and close the fourth switching element in a startup or suspend mode.

11. The driver of claim 10, wherein the controller logic is further configured to disable the current source and open the fourth switching element during normal operation.

12. An apparatus comprising:
a switching device;
a driver including a gate terminal coupled to a control terminal of the switching device, and a ground terminal coupled a source of the switching device, the driver further including;
a voltage regulator configured to generate a first drive voltage from a supply voltage, wherein first drive voltage is less than the supply voltage;
a first storage element configured to store a second drive voltage; and
a drive controller configured to provide the first drive voltage at the control terminal of the switching device and a difference between the supply voltage and the first drive voltage as the second drive voltage to the first storage element in response to a first state of a control signal, and to provide a reverse polarity of the second drive voltage at the control terminal of the switching device in response to a second state of the control signal.

13. The apparatus of claim 12, wherein the switching device comprises a Wide Band Gap (WBG) power semiconductor.

14. The apparatus of claim 12, wherein the switching device comprises a High Electron Mobility Transistor (HEMT).

15. The apparatus of claim 12, wherein the switching device comprises a Gallium Nitride (GaN) Metal Oxide Semiconductor Field Effect Transistor (MOSFET).

16. The apparatus of claim 12, wherein the switching device comprises a Silicon (Si) MOSFET.

17. The apparatus of claim 12, wherein the switching device comprises an Insulated Gate Bipolar Transistor (IGBT).

18. The apparatus of claim 12, wherein the drive controller comprises:
a first switching element coupled between the supply voltage and the first storage element;
a second switching element coupled between the first drive voltage and the gate output of the driver;
a third switching element coupled between the first storage element and a ground potential; and
a controller logic configured to close the first and second switching elements and open the third switching elements in a first state of the control signal, and to open the first and second switching element and close the third switching element in the second state of the control signal.

19. The apparatus of claim 18, wherein the first, second and third switching elements and the controller logic are monolithically fabricated in an integrated circuit (IC).

20. The apparatus of claim 19, wherein the first and second storage elements are externally coupled to the integrated circuit (IC).

21. The apparatus of claim 18, wherein the first, second and third switching elements are co-packaged with the controller logic.

22. The apparatus of claim 21, wherein the first storage element is co-packaged with the controller logic and the first, second and third switching elements.

23. The apparatus of claim 21, wherein the first storage element is externally coupled to the co-packaged controller logic and first, second and third switching elements.

24. The apparatus of claim 18, wherein the first, second and third switching elements are externally coupled to the controller logic.

25. The apparatus of claim 24, wherein the first storage element is externally coupled to the controller logic.

26. A switching device driver method comprising:
receiving a supply voltage at a supply terminal;
receiving a control signal at an input;
stepping down the supply voltage to a first drive voltage;
generating a second drive voltage based on a potential difference between the supply voltage and the first drive voltage; and
outputting the first drive voltage in response to a first state of the control signal and a reverse polarity of the second drive voltage in response to a second state of the control signal at an output.

27. The switching device driver method of claim 26, wherein generating the second drive voltage comprises coupling the supply voltage to a first terminal of a first storage element and coupling the first drive voltage to a second terminal of the first storage element in response to the first state of the control signal.

28. The switching device driver method of claim 27, wherein:
outputting the first drive voltage comprises coupling the first drive voltage to the output in response to the first state of the control signal; and
outputting the reverse polarity of the second drive voltage comprises coupling the second terminal of the first storage element to the output and the first terminal of the first storage element to a ground terminal in response to the second state of the control signal.

29. The switching device driver method of claim 26, further comprising:
enabling the switching device driver method when the supply voltage is within an operational level; and
disabling the switching device driver method when the supply voltage is below the operational level.

30. The switching device driver method of claim 29, further comprising:

charging the first storage element to the second drive voltage before enabling the switching device driver method.

31. The switching device driver method of claim 29, further comprising:
charging the first storage element to the second drive voltage when the control signal is in the second state for more than a predetermined amount of time.

\* \* \* \* \*